(12) United States Patent
Lavoie

(10) Patent No.: US 8,252,680 B2
(45) Date of Patent: Aug. 28, 2012

(54) METHODS AND ARCHITECTURES FOR BOTTOMLESS INTERCONNECT VIAS

(75) Inventor: Adrien R. Lavoie, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/889,790

(22) Filed: Sep. 24, 2010

(65) Prior Publication Data
US 2012/0074571 A1    Mar. 29, 2012

(51) Int. Cl.
*H01L 21/4763* (2006.01)

(52) U.S. Cl. ........ 438/643; 438/618; 438/627; 438/634; 438/687; 438/691; 257/751; 257/754; 257/758; 257/E21.576

(58) Field of Classification Search .................... None
See application file for complete search history.

(56) References Cited

U.S. PATENT DOCUMENTS

| | | | |
|---|---|---|---|
| 2006/0194430 A1* | 8/2006 | Beck | 438/627 |
| 2007/0049007 A1 | 3/2007 | Yang et al. | |
| 2007/0080429 A1* | 4/2007 | Yang et al. | 257/632 |
| 2007/0152342 A1* | 7/2007 | Tsao et al. | 257/774 |
| 2008/0237860 A1* | 10/2008 | Ishizaka et al. | 257/751 |
| 2009/0273085 A1 | 11/2009 | Jourdan et al. | |
| 2010/0009533 A1* | 1/2010 | Shaviv et al. | 438/653 |

OTHER PUBLICATIONS

International Search Report and Written Opinion from International Application No. PCMS2011/053318, filed Sep. 26, 2011; Search Report and Written Opinion mailed Apr. 24, 2012.

* cited by examiner

*Primary Examiner* — Kyoung Lee (57) ABSTRACT

An apparatus includes an interconnect in a recess. The interconnect includes a liner structure and the liner structure in the recess. The liner structure is breached at the recess bottom feature and a bottom interconnect makes a single-interface contact with a subsequent interconnect through the breach.

11 Claims, 6 Drawing Sheets

METHODS AND ARCHITECTURES FOR BOTTOMLESS INTERCONNECT VIAS

Disclosed embodiments relate to semiconductor microelectronic devices and processes of interconnecting them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1A:
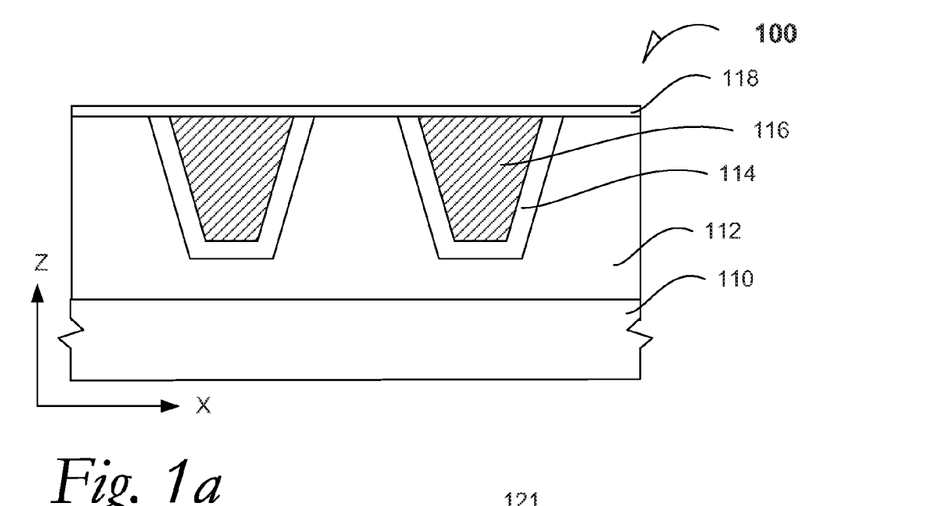
FIG. 1a is a cross-section elevation of a semiconductive device during processing according to an example embodiment.

FIG. 1a is a cross-section elevation of a semiconductive device 100 during processing according to an example embodiment. A semiconductive substrate 110 includes semiconductive material that is useful for formation of a microelectronic device. The substrate 110 may be implemented as typically done, and any number of suitable substrate types and materials can be employed for useful embodiments. In an embodiment, the semiconductive substrate 110 is a bulk semiconductor wafer (e.g., bulk silicon, germanium, gallium arsenide or other III-V materials, etc). In an embodiment, the semiconductive substrate 110 an on-insulator configuration (e.g., silicon on-insulator, germanium on-insulator, silicon germanium on-insulator, indium phosphide on-insulator, etc). In an embodiment, the semiconductive substrate 110 is p-type, n-type, neutral-type, high or low resistivity, off-cut or not off-cut, etc. In an embodiment, the semiconductive substrate 110 is an epitaxial semiconductive layer. In an embodiment, the semiconductive substrate 110 is a fin-shaped semiconductive structure that is prominent above a larger bulk semiconductive structure. In an embodiment, the semiconductive substrate 110 has a vicinal surface that is prepared by off-cutting the semiconductive substrate 110 from an ingot, wherein substrate is off-cut at an angle between, for instance, 2° and 8° (e.g., 4° off-cut silicon).

Interconnect structure embodiments can be implemented on numerous substrates. The substrate thickness can vary and in some embodiments, for example, is in the range of 100 nanometer (nm) to thousands of nanometers. In some cases, the semiconductive substrate 110 is subsequently thinned or removed (e.g., by way of backside polish or other suitable thinning/removal process), after formation of an interconnect structure embodiment and application of protective layer such as etch stop, passivation layer, inter-layer dielectric (ILD), or capping layer, etc.

An interlayer dielectric layer (ILD) 112 is formed on the semiconductive substrate 110. Although no active devices are depicted in the semiconductive substrate 110, they are to be coupled with interconnect embodiments depicted and claimed in this disclosure. The ILD 112 may also be referred to as an ILD0 (zeroth) interlayer dielectric when it is the ILD layer closest to the semiconductive substrate 110. Throughout this disclosure, the ILD 112 will be referred to as the ILD0 for convenience. It should be understood, however, that the ILD 112 may be an $N^{th}$ ILD that envelopes a given interconnect in a multi-level pin-out system such as a $5^{th}$ ILD in a metal-eleven (M11) metallization.

A ILD0 liner 114 is formed in the ILD 112 and a bottom interconnect 116 is formed in ILD 112. The "bottom interconnect" 116 is a relative reference for illustrative purposes to understand a subsequent interconnect (see FIG. 1e, item 452) that is processed to be in direct contact therewith. Further for purposes of this disclosure, the bottom interconnect 116 may be referred to as a "first interconnect", which is a relative reference to an interconnect that is to be placed in direct contact with a "second interconnect" such as the subsequent interconnect 452 seen in FIG. 1e. In an embodiment, the bottom interconnect 116 is a trace, seen in cross section and passing orthogonal to the plane of the drawing. The semiconductive device 100 also has been processed with an etch-stop layer 118, to protect the bottom interconnect 116 as well as the ILD0 112 during processing in other regions of the semiconductive device 100.

Figure 1B:
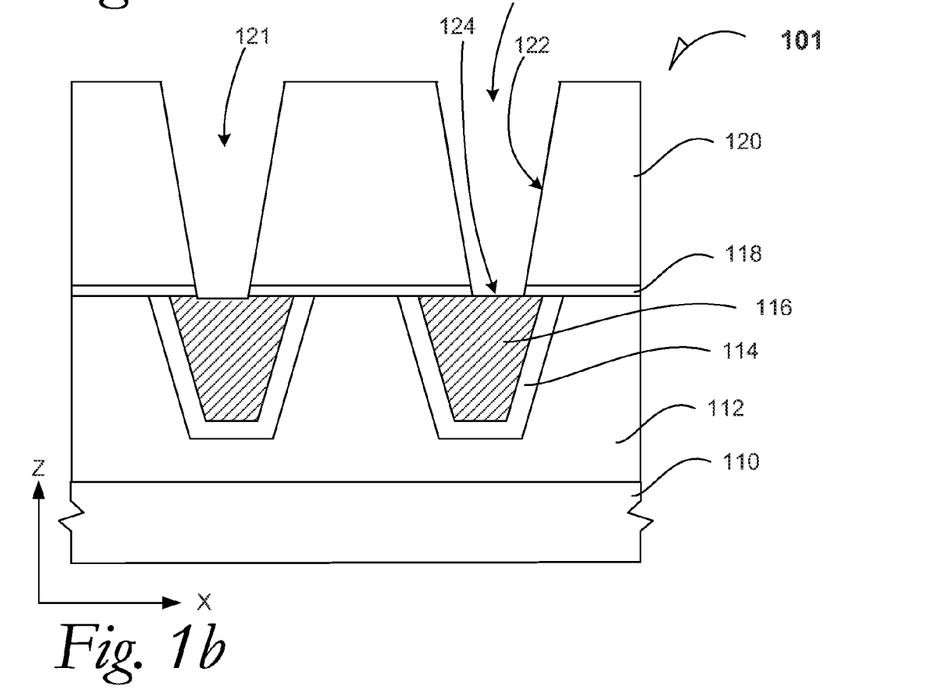
FIG. 1b is a cross-section elevation of the semiconductive device depicted in FIG. 1a during further processing according to an embodiment.

FIG. 1b is a cross-section elevation of the semiconductive device depicted in FIG. 1a during further processing according to an embodiment. The semiconductive device 101 has been processed with an ILD1 120 and a recess 121 has been formed that includes a feature wall 122 and a feature bottom 124. The feature bottom 124 has breached the etch stop layer 118 and exposed an upper surface of the bottom interconnect 116. Currently, the upper surface of the bottom interconnect is the same as the feature bottom 124.

The etch stop layer 118 may be a material such as silicon nitride that is useful in dual damascene processing. In an embodiment, the ILD1 120 is an oxide such as silicon dioxide (SiO2), or carbon-doped oxide (CDO). In an embodiment, the ILD1 120 is a polymer such as perfluorocyclobutane (PFCB). In an embodiment, the ILD1 120 is flurosilicate glass (FSG). Other materials may be used in the formation of the ILD1 120.

Formation of the recess 121 may be done such as with conventional photolithography techniques. In an embodiment, a photolithography technique includes depositing a photoresist material onto the ILD1 120, exposing the photoresist material to ultraviolet radiation using a patterned mask, developing the photoresist material, etching the ILD1 120, and removing some of the photoresist material. The photoresist material that remains after development, functions as a mask to allow only selected portions of the ILD1 120 to be etched, thereby forming structures such as the recess 121.

Figure 1C:
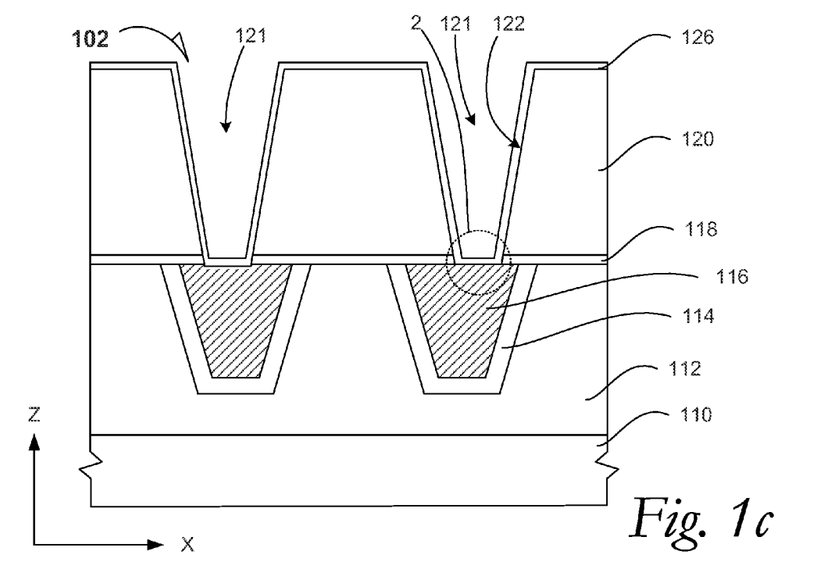
FIG. 1c is a cross-section elevation of the semiconductive device depicted in FIG. 1b after further processing according to an embodiment.

FIG. 1c is a cross-section elevation of the semiconductive device depicted in FIG. 1b after further processing according to an embodiment. The semiconductive device 102 has been processed with a liner structure 126 that has conformally covered exposed surfaces of the recess 121 and covered the feature wall 122 as well as the feature bottom 124.

Figure 2A:
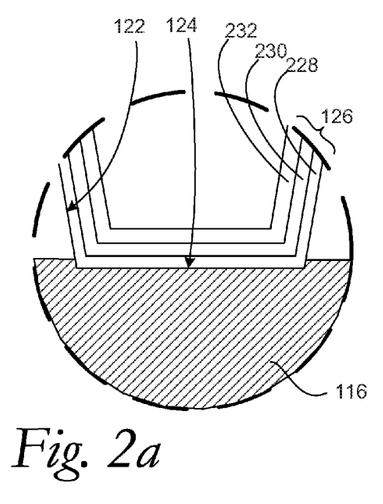
FIG. 2a is a detail section taken from FIG. 1c according to an embodiment.

FIG. 2a is a detail section taken from the section line 2 from FIG. 1c according to an embodiment. The liner structure 126 is depicted with three films including a barrier layer 228, a liner layer 230, and a seed layer 232. The barrier-liner- and seed layers 228, 230, and 232, respectively, may be of various thicknesses as set forth within this disclosure. Processing is followed by any appropriate resputtering method to open the feature bottom 124 and to expose the bottom interconnect 116. For example, the barrier layer 228 and liner layer 230 are formed followed by the seed layer 232, and thereafter the three layers 228, 230, and 232 are resputtered such that the feature wall 122 is not opened but the feature bottom 124 is opened.

Figure 2B:
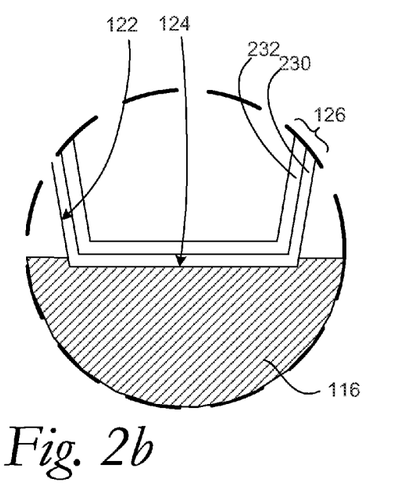
FIG. 2b is a detail section taken from FIG. 1c according to an embodiment.

FIG. 2b is a detail section taken from the section line 2 from FIG. 1c according to an embodiment. The liner structure 126 is depicted with two films including the seed layer 230 and the liner layer 232. The liner- and seed layers 230, and 232, respectively, may be of various thicknesses as set forth within this disclosure. In this embodiment, the barrier layer is omitted and the liner layer 230 is formed to touch the bottom interconnect 116 at the feature bottom 124. The liner layer 230 is sufficient to resist diffusion from the seed layer 232 into the ILD1 120. Processing is followed by any appropriate resputtering method to open the feature bottom 124 and to expose the bottom interconnect 116. For example, the liner layer 230 is formed followed by the seed layer 232, and thereafter the two layers 230 and 232 are resputtered such that the feature wall 122 is not opened but the feature bottom 124 is opened.

Figure 1D:
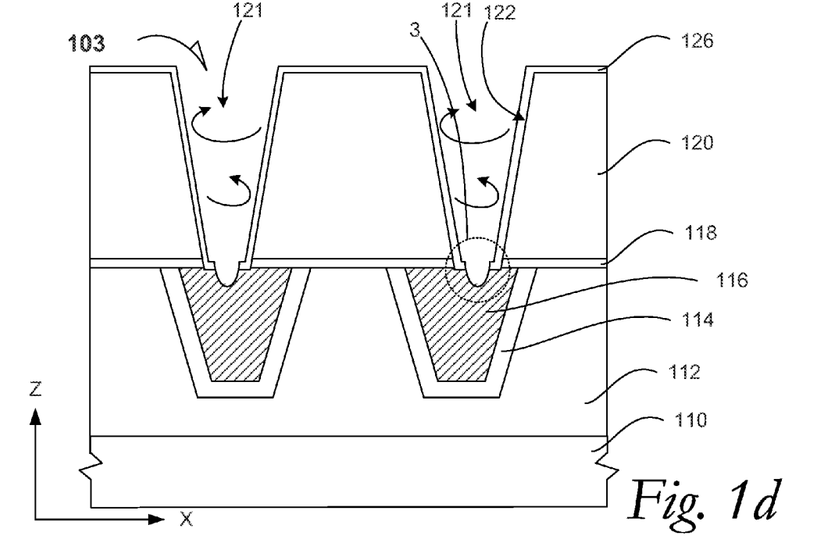
FIG. 1d is a cross-section elevation of the semiconductive device depicted in FIG. 1c after further processing according to an embodiment.

FIG. 1d is a cross-section elevation of the semiconductive device depicted in FIG. 1c after further processing according to an embodiment. The semiconductive device 103 has been processed by a resputtering method to remove a portion of the liner structure 126 from the feature bottom 124. The upwardly directed and curved arrows represent the removal of the liner structure 126 at the feature bottom 124 as well as possible redeposition of some of the liner structure 126 on the feature wall 122. Further, the upwardly directed and curved arrows represent some etching into the bottom interconnect 116. As a consequence of the resputtering method, the bottom interconnect 116 has been re-exposed in preparation for the insertion of an interconnect within the ILD1 layer 120.

Figure 3:
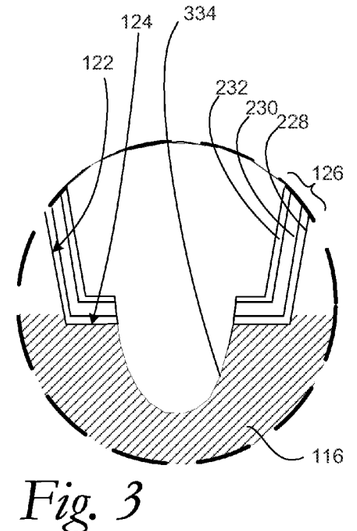
FIG. 3 is a detail section taken from FIG. 1d according to an embodiment.

FIG. 3 is a detail section taken from the section line 3 from FIG. 1d according to an embodiment. The liner structure 126 has been breached at the feature bottom 124 and an interconnect interface 334 is depicted that has excavated into portions of the liner structure 126 and exposed material of the bottom interconnect 116. The process result may also refer to a recessed interconnect interface 334 although the interconnect interface 334 may be substantially at the same level as the feature bottom 124. The degree of pitting of the recessed interconnect interface 334 may be quantified by a ratio of the depth of the recessed interconnect interface 334 below the level of the feature bottom 124, divided by the width of the feature bottom 124 as measured in the X-direction. Visual inspection of this ratio illustrated in FIG. 3 reveals an approximate dimensionless ratio of 0.4. In an embodiment, the ratio is zero. In an embodiment, the ratio is between zero and two. In an embodiment, the ratio is 0.4. In an embodiment, the ratio is 0.6.

It may now be appreciated where the process embodiments that include less than three liners during processing (see FIG. 2b), the interconnect interface 334 may be exposed through the feature bottom 124 with as few as one or two liners present.

In an embodiment, the barrier layer 228 alone is formed upon the feature wall 122 and the feature bottom 124, followed by a resputtering method to expose the bottom interconnect 116 at the feature bottom 124. Such resputtering may or may not result in a degree of pitting in the bottom interconnect 116 to form the recessed interconnect interface 334 as illustrated. Thereafter, the liner layer 230 and the seed layer 232 are formed according to this embodiment, followed by a re-sputtering method to expose the bottom interconnect 116 at the feature bottom 124. Consequently, two resputtering processes are conducted to expose the bottom interconnect 116 though liner materials at the feature bottom.

In an example of this process embodiment, the barrier layer 228 is first formed by sputtering a tantalum (Ta) target in a first processing tool at a direct-current (DC) bias in a range from 5 kilowatt (kW) to 40 kW and with a non-zero radio-frequency (RF) bias in a range from greater than zero to 1 kW. When the barrier layer 228 has reached a useful thickness of about 30 nm, the DC bias is turned off (where the substrate 110 is biased though a wafer chuck in the first tool) and the RF bias is allowed to remain turned on to achieve a breach in the barrier layer 228 at the feature bottom 124.

Next in this example embodiment, the liner layer 230 is formed by sputtering a ruthenium (Ru) target in a second processing tool at a DC bias in a range from 5 kW to 40 kW and with a non-zero RF bias in a range from greater than zero to 1 kW. When the liner layer has reached a useful thickness of about 34 nm, the second tool DC and RF biases are shut off.

Next in this example embodiment, the seed layer 232 is formed by plasma-enhanced conformal atomic layer deposition (PECALD) in a third processing tool to form a copper (Cu) seed layer 232.

After formation of the copper seed layer 232 and the liner layer 230, the semiconductive device 103 is moved to a subsequent processing tool to resputter the seed layer 232 and the liner layer 230 by use of an RF bias.

In an embodiment, the barrier layer 228 and the liner layer 230 together are formed upon the feature wall 122 and the feature bottom 124, followed by a re-sputtering method to expose the bottom interconnect 116 at the feature bottom 124. For example, there is a tandem application of barrier layer 228 and the liner layer 230 to clear liner structure material from the feature bottom 124. Thereafter, the seed layer 232 is formed, followed by a re-sputtering method to expose the bottom interconnect 116 at the feature bottom 124.

In an embodiment, the barrier layer 228 and the liner layer 230 together are formed upon the feature wall 122 and the feature bottom 124, followed by a re-sputtering method to expose the bottom interconnect 116 at the feature bottom 124.

For example, there is a tandem application of barrier layer 228 and the liner layer 230 to clear liner structure material from the feature bottom 124. Clearing of the barrier layer 228 and the liner layer 230 is carried out by a pulsed RF bias with Wattage intensities set forth in this disclosure and as set forth below. In an example embodiment, pulsing is between cycles of deposition of the barrier layer 228 and the liner layer 230. In an example embodiment, pulsing is after the tandem application barrier layer 228 and the liner layer 230. In an embodiment, pulsing is carried out with a nonzero RF bias that reaches up to 10 V for about 0.1 seconds, followed by a rest period and a repeat pulsed RF bias.

After an RF biasing embodiment, the seed layer 232 is formed, followed by a re-sputtering method to expose the bottom interconnect 116 at the feature bottom 124.

It may now be appreciated that one processing embodiment includes forming all three layers of the liner structure 126, followed by a re-sputtering. One processing embodiment includes each layer being formed individually followed by a re-sputtering of each layer. One processing embodiment includes each layer being formed individually followed by a pulsed re-sputtering of each layer or of more than one layer. One processing embodiment includes the first two layers being formed followed by an RF-driven resputtering and the third layer being formed followed by a re-sputtering. One processing embodiment includes the first two layers being formed followed by pulsed RF resputtering and the third layer being formed followed by a re-sputtering. Each of these processing embodiments may be useful for a given application.

In a processing embodiment, the liner structure 126 is formed by sputtering a ruthenium barrier layer 228 under a DC bias and an RF bias, followed by turning off the DC bias. As a consequence of this method, the feature bottom 124 is resputtered to expose the bottom interconnect 116.

In a processing embodiment, the liner structure is formed by sputtering a barrier layer 228, a liner layer 230, and a seed layer 232, each sequentially in separate processing tools. Thereafter, the semiconductive device 103 is placed in a processing tool and only an RF bias is left in place and the feature bottom 124 is reputtered to expose the bottom interconnect 116.

In an embodiment, the RF bias is increased to an amount greater than that used during forming the layer and resputtering is achieved. In an embodiment, the RF bias is held constant to the same amount that is used during forming the layer and resputtering is achieved. In an embodiment, the RF bias is decreased to an amount less than that used during forming the layer and resputtering is achieved.

Figure 1E:
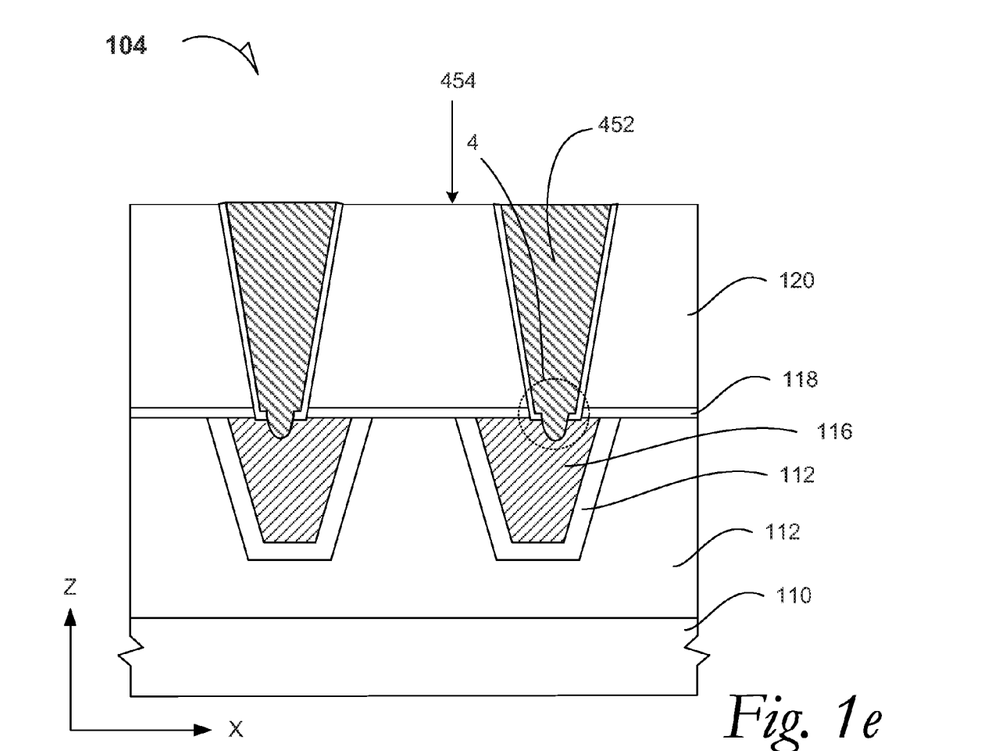
FIG. 1e is a cross-section elevation of the semiconductive device depicted in FIG. 1d after further processing according to an embodiment.

FIG. 1e is a cross-section elevation of the semiconductive device depicted in FIG. 1d after further processing according to an embodiment. The semiconductive device 104 has been processed such that a subsequent interconnect 452 has been filled into the recess 121 (see FIG. 1d). In an embodiment, the subsequent interconnect 452 has been formed by a copper electroplating onto the seed layer 232. A planarization process has also been carried out to achieve a subsequent surface 454 in preparation for more similar interconnect processing if useful.

It may now be understood that the bottom interconnect 116 may be a trace in a complex metallization. For example, the bottom interconnect 116 may be an M7 in an M11 metallization and the subsequent interconnect 452 is a filled via that is to couple the bottom interconnect at M7 to a third interconnect that will directly contact the subsequent interconnect 452 by the same processing manner that has been disclosed for connecting the bottom interconnect 116 to the subsequent interconnect. Consequently in this example embodiment, the third interconnect may be an M8 trace that is to contact the subsequent interconnect 452 at the subsequent surface after formation of an ILD at that level.

Figure 4:
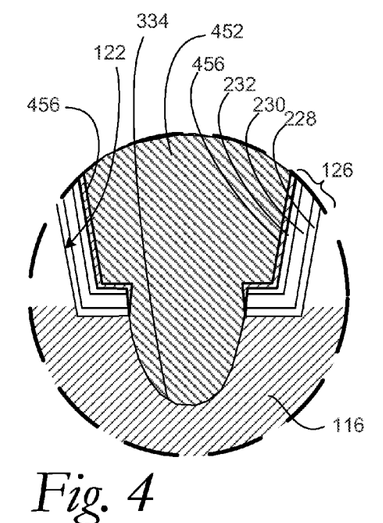
FIG. 4 is a detail section taken from FIG. 1e according to an embodiment.

FIG. 4 is a detail section taken from FIG. 1e along the section line 4 according to an embodiment. The detail section 4 indicates the subsequent interconnect 452 has filled into the interconnect interface 334 such that a copper-copper single-resistance interface exists between the bottom interconnect 116 and the subsequent interconnect. The bottom interconnect 116, the interconnect interface 334, and the subsequent interconnect 452 are referred to herein as an interconnect structure. They may also be referred to as a bottomless interconnect via structure.

In an embodiment, the subsequent interconnect 452 may form an interface with resputtered material 456 upon the feature wall 122 and also upon any remaining portion of the feature bottom 124. The resputtered material 456 may also not be present such as is achieved by useful resputtering embodiments. It may now be appreciated that a single-interface interconnect junction 334 is formed between the bottom interconnect 116 and the subsequent interconnect 452. The single-interface interconnect junction may also be referred to as the bottomless interconnect via. Whether resputtering deposition has been done to leave resputtered material 456 upon the feature wall 122, or whether resputtering has been done to leave a substantially clean seed layer 232, examination of the liner structure 126 may reveal that the liner structure 126 has a breach that is characteristic of a resputtering process at the feature bottom 124.

In a resputtering embodiment, the RF bias is decreased to a nonzero amount below the 1 kW intensity after turning off the DC bias. For example, where the RF bias is 1 kW during deposition of the liner layer 230, the RF bias is decreased by half to 0.5 kW until the feature bottom 124 has returned to an exposed bottom interconnect 116. Pitting into the bottom interconnect 116 to form an interconnect interface 334 may also occur.

In a resputtering embodiment, the RF bias is unchanged and held at a nonzero amount at or below the 1 kW intensity after turning off the DC bias. For example, where the RF bias is 0.8 kW during deposition of the liner layer 230, the RF bias is held steady to 0.8 kW until the feature bottom 124 has returned to an exposed bottom interconnect 116. Pitting into the bottom interconnect 116 to form the interconnect interface 334 may also occur.

In a resputtering embodiment, the RF bias is increased to a nonzero amount below the 1 kW intensity after turning off the DC bias. For example, where the RF bias is 0.2 kW during deposition of the liner layer 230, the RF bias is increased to 0.6 kW until the feature bottom 124 has returned to an exposed bottom interconnect 116. Pitting into the bottom interconnect 116 to form the interconnect interface 334 may also occur. It may now be understood that the processing by use of an RF bias may also be a pulsed amount and that pulsed amount may be equal to the RF bias during a given deposition process, less than the RF bias during the given deposition process, and more than the RF bias during the given deposition process. It should be understood that the processing results are three separate embodiments that exhibit separate results.

Resistivity is lowered when the interconnect interface 334 includes, e.g., a copper bottom interconnect 116, and a copper subsequent interconnect 452. In a comparative structure that includes a liner structure with a bottom interconnect, a barrier layer, a liner layer, a seed layer, and a subsequent interconnect, the series resistance is measured at 20 Ohm ($\Omega$). In an example embodiment with all other conditions equivalent to the comparative structure, the example embodiment includes the interconnect interface with copper 116 on copper 452 and the series resistance is lowered by at least 20%. This series resistance lowering is attributed to the single resistance interface that is formed at the junction between the bottom interconnect 116 and the subsequent interconnect 452. In an embodiment, the series resistance is 16Ω with a 20% lowering of the series resistance. In an embodiment, the series resistance is 10Ω with a 50% lowering of the series resistance. In an embodiment, the series resistance is 5Ω with a 75% lowering of the series resistance. It may now be appreciated that the series resistance lowering may be the given 20%, between 20% and 50%, between 20% and 75% as example embodiments and applied to a comparative example with a different series resistance than the example 20Ω.

Figure 5:
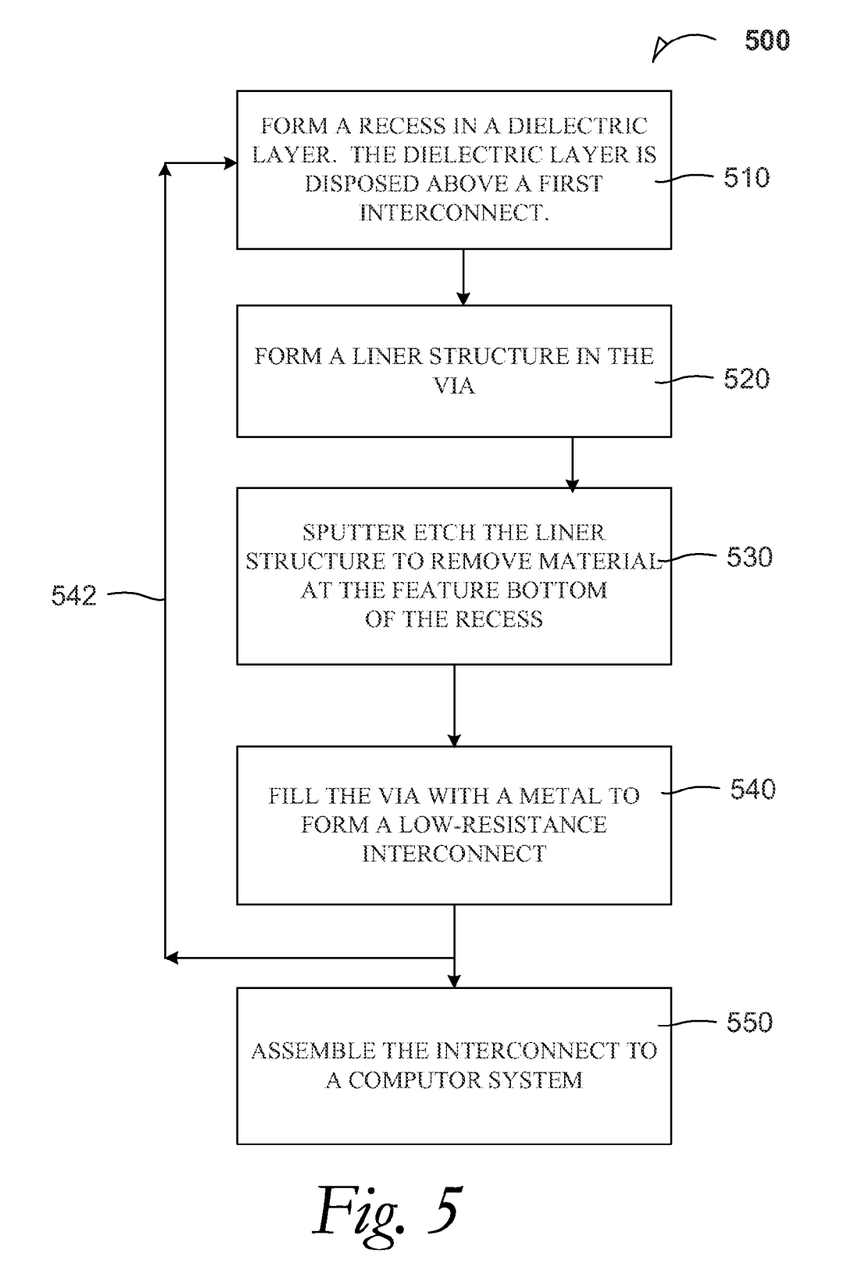
FIG. 5 a process and method flow diagram according to several embodiments.

FIG. 5 a process and method flow diagram 500 according to several embodiments.

At 510, the process includes forming a recess in a dielectric layer, wherein the dielectric layer is disposed above first interconnect. It may be understood as shown in the illustrations that a first interconnect process embodiment is the bottom interconnect 116 as illustrated. It may also be understood that a "bottom interconnect" process embodiment is a repetition of previous processing in a complex metallization as described herein.

At 520, the process includes forming a liner structure in the recess. In a non-limiting example embodiment, a liner structure 126 is formed by forming a barrier layer 228, a liner layer 230, and a seed layer 232. Other disclosed embodiments may be used to form the liner structure such as that depicted in FIG. 2a or 2b.

At 530, the process includes sputter etching the liner structure to remove material at the feature bottom feature of the recess. In a non-limiting example embodiment, the barrier layer 228, the liner layer 230, and the seed layer 232 are all formed and then the semiconductive device 102 (FIG. 1c) is moved to a new processing tool and sputter etching is carried out under any RF biased sputtering embodiment to achieve the semiconductive device 103 depicted in FIG. 1d.

At 540, the process includes filling the recess with an electrical conductor to form a low-resistance, interconnect junction. In a non-limiting example embodiment, a copper bottom interconnect 116 with a interconnect interface 334 that was formed by any disclosed processing embodiments, is contacted with a copper subsequent interconnect 452.

At 542, the process includes repeating the processes of 510, 520, 530, and 540. In a non-limiting example embodiment, the subsequent interconnect 452 becomes a "first interconnect" as defined herein and processing is repeated accordingly. In a non-limiting example embodiment, the process is repeated but the subsequent interconnect 452 is not a "first interconnect", but the interconnects are coupled in a complex metallization.

At 550, a method embodiment includes assembling the interconnect structure into a computing system. In a non-limiting example embodiment, the interconnect structure 116, 334, and 452 is part of a device manufactured by Intel Corporation if Santa Clara, Calif. such as a processor. In an embodiment, the interconnect structure 116, 334, and 452 is part of a system on a chip (SoC) such as a generic processor and a graphics processor, for example an SoC that has integrated microarchetectures of a processor and graphics on the same semiconductive substrate. In an embodiment, the interconnect structure 116, 334, and 452 is part of a system in a package (SiP) such as a processor that is coupled to and packaged with an RF transceiver in a single coreless substrate. The interconnect structure 116, 334, and 452 may also be referred to as a single-interface interconnect junction.

Barrier Layers

Several barrier materials may be used in formation of the liner structure 126. In an embodiment, tungsten (W) metal is used and deposited by PVD as the barrier layer 228. In an embodiment, tantalum (Ta) metal is used. In an embodiment, tantalum nitride (TaN) material is used. In an embodiment, titanium (Ti) metal is used. In an embodiment, titanium nitride (TiN) material is used.

It may be appreciated that the each of the several enumerated barrier layer materials and their equivalents may be combined with at least one other of the enumerated barrier layer materials depending upon useful implementations of the several disclosed embodiments Liner Layers Several liner materials may be used in the formation of the liner structure 126. In an embodiment, ruthenium (Ru) metal is used and deposited by PVD as the liner layer 230. In an embodiment, cobalt (Co) metal is used. In an embodiment, tungsten (W) metal is used. In an embodiment, iridium (Ir) metal is used. In an embodiment, palladium (Pd) metal is used. In an embodiment, platinum (Pt) metal is used. In an embodiment, rhodium (Rh) metal is used. In an embodiment, molybdenum (Mo) metal is used.

It may be appreciated that the each of the several enumerated liner layer materials and their equivalents may be alloyed with at least one other of the enumerated liner layer materials depending upon useful implementations of the several disclosed embodiments.

It may now also be appreciated that each of the several enumerated liner layer materials may be combined with any of the several enumerated barrier layer materials depending upon useful implementations of the several disclosed embodiments.

Seed Layers

In an embodiment, a dopant is added to the seed layer 232 such that it facilitates not alloying with the liner layer 230. In an example embodiment, a Cu—Mn alloyed seed layer 232 is provided and the barrier layer 228 may be eliminated. This is because the Cu—Mn alloy seed layer 232 may provide the barrier functionality. The seed layer 232 can be deposited on the liner layer 230, for example, using PVD, CVD or ALD (including plasma enhanced ALD, or PEALD) processes, or any other suitable deposition technique. The seed layer 232 is alloyed with a dopant that will not alloy or react with the liner layer 230. The presence of the alloying metal inhibits electromigration of the seed layer metal such as copper. In an embodiment, the alloyed seed layer 232 is deposited using ALD to provide a conformal seed layer in the range of 1 nm to 50 nm such as 1 to 15 nm. In an example embodiment, an alloyed copper (Cu) seed layer 232 is deposited on a Ru liner layer 230 using a PVD process. The copper to be deposited is effectively pre-alloyed in that it includes a percentage of Mn or Mg (or other suitable dopant that will not alloy or react with the Ru liner layer 230. The percentage of the dopant content can vary, but in some embodiments is in the range of 3% to 15% such as 5% Mg, or 5% Mn. In an embodiment, a hybrid dopant content of 2.5% Mn and 2.5% Mg is used to dope a copper seed layer 232. In any such cases, the PVD sputtering process generally yields a conformal layer of the alloyed seed material. The alloyed seed layer may have a thickness, for example, in the range of 1 nm to 30 nm such as 10 nm to 15 nm.

In an example embodiment, the alloyed seed layer 232 is formed in a layered fashion using a PEALD process, where a layer of copper is deposited and then a layer of magnesium and/or manganese is deposited. This layering process embodiment can be repeated a number of times to provide alternating layers of Cu and Mg and/or Mn. The thickness of each of these layers can vary from one embodiment to the next, but in some example cases the thicknesses range from 0.5 nm to 20 nm such as 2 nm to 5 nm for each layer, or 2-5 nm for each copper layer and 1-3 nm for each magnesium/manganese layer. After deposition of the alternating layers is completed, the stack of layers is annealed to the seed layer 232. The anneal can be carried out, for example, at a temperature in the range of 50° C. to 400° C. for a time duration that may last from 5 seconds to 2 minutes, and may take place in an oxygen free ambient atmosphere, such as forming gas or a non-reactive gas. During the anneal, the alloy metal layers and the copper metal layers intermix or diffuse together to merge and form the alloyed seed layer 232. Other annealing techniques will now be apparent in light of this disclosure. In any such cases, a PEALD process can be used to provide a conformal and continuous alloy layer and allows for control over the thickness of the copper-alloy seed layer (by way of the number of PEALD pulses), and over the tailoring or composition of the copper-alloy seed layer (e.g., by way of modifying the precursors and/or co-reactants used in each PEALD pulse). Other embodiments may be used such as any suitable PVD, CVD or ALD processes as previously explained. The alloyed seed layer 232 can be continuous or discontinuous on the recess 121 at the wall feature 122.

In some layered seed-layer embodiments, the alloyed seed layer 232 may be homogenous across its thickness. For instance, a copper seed layer 232 is alloyed with magnesium or manganese in accordance with one example, the concentration of copper and the alloy metal is homogenous throughout the alloyed seed layer. In an embodiment, the alloyed seed layer 232 is a graded layer. For example, where a copper seed layer is alloyed with manganese or magnesium, the copper content has a concentration gradient across the thickness of the copper seed layer 232, and/or the alloy metal manganese/magnesium has a concentration gradient across the thickness of the copper seed layer 232. In an example embodiment, a first portion of a graded copper-alloy seed layer 232 that is next to the ILD1 120 has a high alloy metal concentration and functions to reduce or prevent electromigration of the copper metal. The high alloy metal concentration further serves as a barrier layer to inhibit copper metal from diffusing into the dielectric layer that is ILD1 120. A second portion of the graded copper-alloy seed layer that is near to the via 121 has a high copper metal concentration to serve as a nucleation site for copper deposition during a subsequent electroplating or electroless plating process to fill the via 121 with a subsequent interconnect 452.

In an embodiment, the seed layer 232 is formed by use of a catalytically enhanced atomic layer deposition (CEALD) process to deposit copper metal into the recess 121 during a damascene process to form low-resistance, single interface interconnect structure. A CEALD process is an ALD process that uses a catalyst to enhance or accelerate the deposition rate of the seed metal being deposited. In some CEALD process embodiments, iodine is used as the catalyst. For purposes of this disclosure, however, CEALD refers to an atomic layer deposition process that uses any catalyst.

Figure 6:
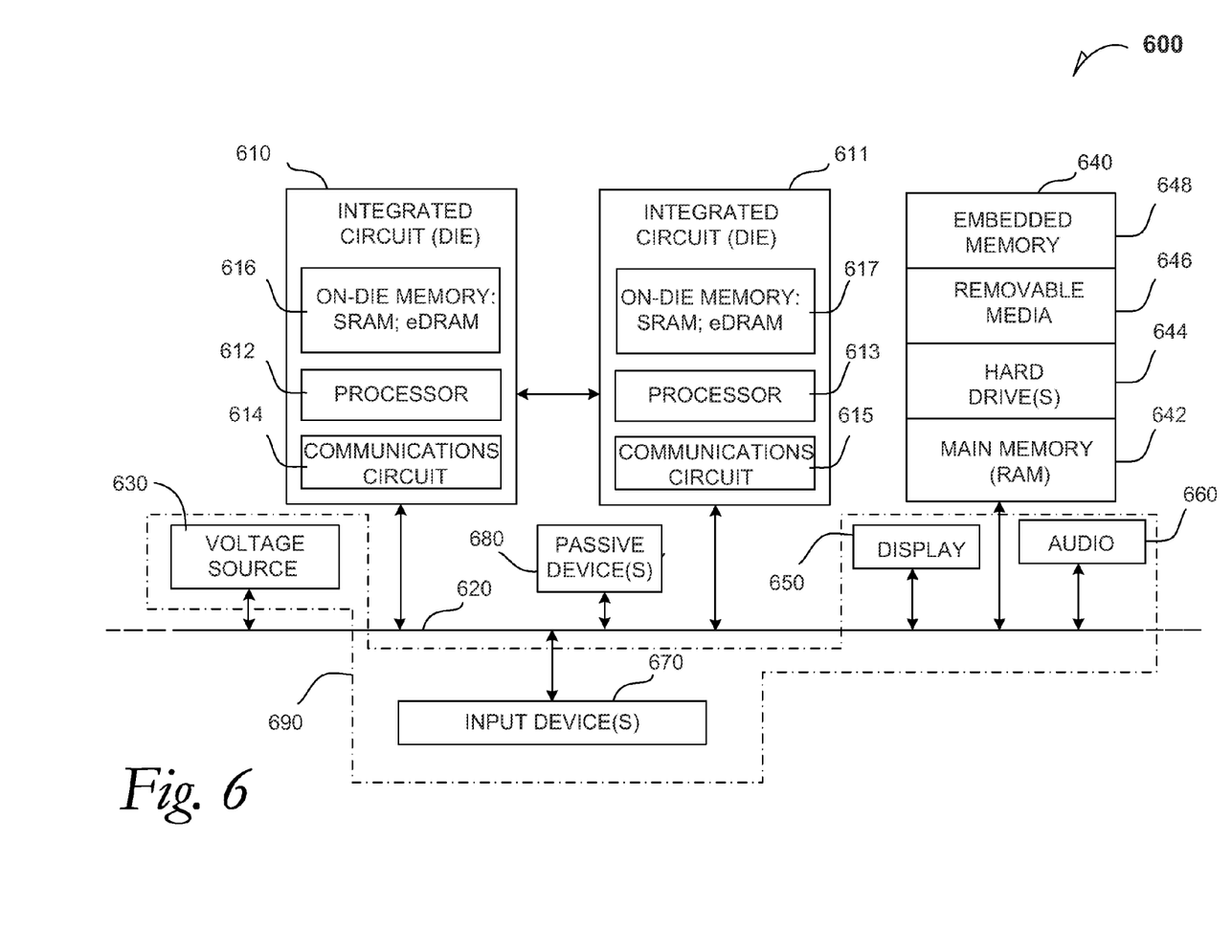
FIG. 6 is a schematic of a computer system according to an embodiment.

FIG. 6 is a schematic of a computer system 600 according to an embodiment. The computer system 600 (also referred to as the electronic system 600) as depicted can embody a single-interface interconnect junction according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be integral to an automobile. The computer system 600 may be integral to a television.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 is an TSV embedded die disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems. In an embodiment, the processor 610 includes on-die memory 616 such as static random-access memory (SRAM). In an embodiment, the processor 610 includes embedded on-die memory 616 such as embedded dynamic random-access memory (eDRAM).

In an embodiment, the integrated circuit 610 is complemented with a subsequent integrated circuit 611 such as a graphics processor in connection with a more generic processor 610. In an embodiment, the integrated circuit 610 is complemented with a subsequent integrated circuit 611 that is coupled to integrated circuit 610. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

The computer system 600 may also include passive devices 680 that are coupled to active devices such as the integrated circuit 610. In an embodiment, the passive device 680 is an inductor that is used for an RF circuit.

A foundation substrate 690 may be part of the computing system 600. In an embodiment, the foundation substrate 690 is a motherboard that holds a semiconductive device with a single-interface interconnect junction embodiment. In an embodiment, the foundation substrate 690 is a board onto which a semiconductive device with a single-interface interconnect junction is mounted. In an embodiment, the foundation substrate 690 incorporates at least one of the functionalities encompassed within the dashed line 690 and is a substrate such as the user shell of a wireless communicator.

As shown herein, the integrated circuit 610 can be implemented in a number of different embodiments, including a single-interface interconnect junction in a die according to any of the several disclosed embodiments and their equivalents, an electronic system, a computer system, one or more methods of fabricating an integrated circuit, and one or more methods of fabricating an electronic assembly that includes a single-interface interconnect junction die according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a single-interface interconnect junction die according to any of the several disclosed single-interface interconnect junction die embodiments and their equivalents.

Although a die may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
    forming a recess in a dielectric layer, wherein the dielectric layer is disposed above and on a first interconnect, wherein the recess includes a feature wall and a feature bottom, and wherein forming the recess exposes at least a portion of the first interconnect at the feature bottom; and
    forming a liner structure in the recess under conditions to remove the liner structure from the feature bottom and to expose the first interconnect at an upper surface thereof, and wherein forming the liner structure includes:
    forming a barrier first layer in the recess to cover the feature wall and the feature bottom;
    forming a liner second layer in the recess to cover the barrier first layer;
    applying a radio frequency (RF) bias under conditions to remove the barrier first layer and the liner second layer from the feature bottom;
    forming a seed third layer in the recess to cover the liner second layer and the feature bottom; and
    applying an RF bias under conditions to remove the seed layer from the feature bottom and to expose the first interconnect at an upper surface thereof.

2. The process of claim 1, further including:
    filling the recess with a second interconnect material under conditions to form a single-resistance interface between the first interconnect and the second interconnect material; and
    planarizing the second interconnect material to form a second interconnect.

3. The process of claim 1, wherein the RF bias to remove the barrier first layer and the liner second layer is carried out under conditions to form resputtered material upon the feature wall.

4. The process of claim 1, wherein the RF bias to remove the seed third layer is carried out under conditions to form resputtered material upon the feature wall.

5. A process comprising:
    forming a recess in a dielectric layer, wherein the dielectric layer is disposed above and on a first interconnect, wherein the recess includes a feature wall and a feature bottom, and wherein forming the recess exposes at least a portion of the first interconnect at the feature bottom; and
    forming a liner structure in the recess under conditions to remove the liner structure from the feature bottom and to expose the first interconnect at an upper surface thereof, wherein forming the liner structure includes:
    forming a barrier first layer in the recess to cover the feature wall and the feature bottom;
    forming a liner second layer in the recess to cover the barrier first layer;
    forming a seed third layer in the recess to cover the liner second layer and under conditions to breach the barrier first layer, the liner second layer, and the seed third layer and to expose the first interconnect at the feature bottom, and wherein the conditions include a direct-current (DC) and an RF first-bias physical vapor deposition and an RF second-bias resputter process;
    filling the recess upon the seed third layer with a second interconnect material under conditions to form a single resistance interface between the first interconnect and the second interconnect material;

and planarizing the second interconnect material to form a second interconnect.

6. A process comprising:

forming a recess in a dielectric layer, wherein the dielectric layer is disposed above and on a first interconnect, wherein the recess includes a feature wall and a feature bottom, and wherein forming the recess exposes at least a portion of the first interconnect at the feature bottom; and forming a liner structure in the recess under conditions to remove the liner structure from the feature bottom and to expose the first interconnect at an upper surface thereof, wherein the conditions to remove the liner structure from the feature bottom and to expose the first interconnect at an upper surface thereof include carrying out at least one pulsed RF re-deposition process on the liner structure.

7. The process of claim 6, wherein forming the liner structure includes sputtering the liner structure with a radio frequency (RF) bias, wherein to expose the first interconnect at the upper surface thereof, one is used of increasing the RF bias, holding the RF bias constant, and decreasing the RF bias.

8. A process comprising:

forming a recess in a dielectric layer, wherein the dielectric layer is disposed above and on a first interconnect, wherein the recess includes a feature wall and a feature bottom, and wherein forming the recess exposes at least a portion of the first interconnect at the feature bottom; and forming a liner structure in the recess under conditions to remove the liner structure from the feature bottom and to expose the first interconnect at an upper surface thereof, wherein forming the liner structure includes sputtering the liner structure with a pulsed radio frequency (RF) bias to expose the first interconnect.

9. The process of claim 8, wherein to expose the first interconnect at the upper surface thereof, one is used of increasing the RF bias, holding the RF bias constant, and decreasing the RF bias.

10. A process comprising:

forming a recess in a dielectric layer, wherein the dielectric layer is disposed above and on a first interconnect, wherein the recess includes a feature wall and a feature bottom, and wherein forming the recess exposes at least a portion of the first interconnect at the feature bottom; and forming a liner structure in the recess under conditions to remove the liner structure from the feature bottom and to expose the first interconnect at an upper surface thereof, wherein forming the liner structure includes sputtering the liner structure with a pulsed radio frequency (RF) bias to expose the first interconnect.

11. A process comprising:

forming a recess in a dielectric layer, wherein the dielectric layer is disposed above and on a first interconnect, wherein the recess includes a feature wall and a feature bottom, and wherein forming the recess exposes at least a portion of the first interconnect at the feature bottom; and forming a liner structure in the recess under conditions to remove the liner structure from the feature bottom and to expose the first interconnect at an upper surface thereof, wherein forming the liner structure includes sputtering the liner structure with a pulsed radio frequency (RF) bias to expose the first interconnect, wherein to expose the first interconnect at the upper surface thereof, one is used of increasing the RF bias, holding the RF bias constant, and decreasing the RF bias.

* * * * *